(12) United States Patent
Ebihara

(10) Patent No.: US 6,881,896 B2
(45) Date of Patent: Apr. 19, 2005

(54) SEMICONDUCTOR DEVICE PACKAGE

(75) Inventor: Masami Ebihara, Kanagawa (JP)

(73) Assignee: NEC Compound Semiconductor, Ltd., Kanagawa (JP)

( * ) Notice: Subject to any disclaimer, the term of this patent is extended or adjusted under 35 U.S.C. 154(b) by 0 days.

(21) Appl. No.: 10/847,306

(22) Filed: May 18, 2004

(65) Prior Publication Data

US 2004/0231879 A1 Nov. 25, 2004

(30) Foreign Application Priority Data

May 20, 2003  (JP) ........................................ 2003-142662

(51) Int. Cl.$^7$ ................................................ H05K 9/00
(52) U.S. Cl. ................................ 174/35 GC; 361/752; 361/753; 361/816
(58) Field of Search ........................ 174/35 R, 35 GC, 174/35 MS; 361/752, 753, 760, 767, 799, 800, 816, 818, 807

(56) References Cited

U.S. PATENT DOCUMENTS

| 4,218,578 | A | * | 8/1980 | Olschewski et al. | ...... | 174/35 R |
| 5,757,251 | A | * | 5/1998 | Hashinaga et al. | ......... | 333/246 |
| 5,838,551 | A | * | 11/1998 | Chan | .......................... | 361/818 |
| 5,959,842 | A | * | 9/1999 | Leonard et al. | ............. | 361/752 |
| 6,768,654 | B1 | * | 7/2004 | Arnold et al. | ............... | 361/818 |

FOREIGN PATENT DOCUMENTS

| JP | 1-165650 U | 11/1989 |
| JP | 3-65299 U | 6/1991 |
| JP | 5-175351 A | 7/1993 |
| JP | 8-136771 A | 5/1996 |
| JP | 9-51183 A | 2/1997 |
| JP | 10-41665 A | 2/1998 |

* cited by examiner

Primary Examiner—Dean A. Reichard
Assistant Examiner—Carmelo Oliva
(74) Attorney, Agent, or Firm—Foley & Lardner LLP

(57) ABSTRACT

A semiconductor device package includes a substrate, a semiconductor device formed on the substrate, a ground electrode formed on the substrate, a cover designed for covering the semiconductor device, and a tab unit extending from the cover and for holding the substrate. The cover has an outer surface made of conductive material and an inner surface made of insulation material, where the insulating inner surface faces the semiconductor device. The tab unit has a first contact surface which extends from the conductive outer surface and is contact with the ground electrode.

14 Claims, 6 Drawing Sheets

SEMICONDUCTOR DEVICE PACKAGE

BACKGROUND OF THE INVENTION

1. Field of the Invention

The present invention relates to a package for a high frequency semiconductor device such as a high frequency oscillator (HFO) whose oscillation frequency belongs to, for example, a GHz band. More particularly, the present invention relates to a semiconductor device package, which is designed as a shielding case for surface mounting, for preventing an electromagnetic interference (EMI) and improving a productivity.

2. Description of the Related Art

A high frequency oscillator (HFO) is formed by using a dielectric substance or a strip line and used in, for example, a mobile communications device. In such a high frequency oscillator, an electromagnetic interference (EMI) is easily caused by an electric influence from outside. Therefore, a semiconductor device package is necessary, with which semiconductor devices are encapsulated and shielded.

Japanese Laid Open Utility Model Application (JP-Heisei 1-165650) discloses an IC package including a cover and a ceramic substrate on which an IC is mounted. The cover has tab units which hold opposite side surfaces of the ceramic substrate. Also, this cover has a plurality of pinna sections to be located over the IC.

Japanese Laid Open Utility Model Application (JP-Heisei 3-65299) discloses a shield-package-type circuit device including a ceramic substrate, a ground metal layer, a conductive section, a metal frame, and a shield cap. The ground metal layer is formed in the ceramic substrate. The conductive section is formed on the ceramic substrate and electrically connected to the ground metal layer. The metal frame is formed on the edge of the ceramic substrate and electrically connected to the conductive section. The shield cap for covering devices on the ceramic substrate is fit to the metal frame.

Japanese Laid Open Patent Application (JP-Heisei 5-175351) discloses a semiconductor device package including a radiator metal base, an exterior case attached to the edge of the radiator metal base to form a surrounding outer wall, and a case cover for covering the semiconductor device. Circuit parts and lead terminals are mounted on the radiator metal base. Silicon-gel and epoxy-resin is filled in the exterior case to seal the circuit parts and the lead terminals. The case cover has a rectangular shape. An engagement tab section is provided on one side of the case cover, which is engaged with the exterior case. A protrudent leg section is provided on the opposite side of the one side, which is embedded in the epoxy-resin. Slide tab sections are provided on the other sides of the case cover, which are engaged with edges of the exterior case.

Japanese Laid Open Patent Application (JP-Heisei 8-136771) discloses an optical transmission module which has a receptacle with a convex cross section. This optical transmission module has a cover which can cover that convex receptacle.

Japanese Laid Open Patent Application (JP-Heisei 9-51183) discloses electronic parts including a electronic circuit substrate and a metallic frame on which the electronic circuit substrate is placed. Electronic devices are mounted on the principal surface of the electronic circuit substrate. At least one concave portion is formed on at least one side of the electronic circuit substrate. The metallic frame has a convex portion which is engaged with the concave portion and is used for alignment.

Japanese Laid Open Patent Application (JP-Heisei 10-41665) discloses an oscillator. The oscillator has an insulation substrate, four side electrodes, and a metal cover. The insulation substrate has a rectangular shape, and a ground electrode is formed on a back side of the insulation substrate. The four side electrodes are formed on four sides of the insulation substrate and electrically connected to the ground electrode. The metal cover has four tab units which are formed on four sides of the metal cover and electrically connected to the four side electrodes, respectively. The tab units on opposite sides of the metal cover and the corresponding side electrodes are joined with solder. Each of the tab units on the other opposite sides of the metal cover has a protruded section, and the tab units are strongly engaged with the corresponding side electrodes.

FIGS. 1 to 3 are views explaining one conventional example of such a high frequency semiconductor device package. FIG. 1 is an exploded perspective view of the high frequency semiconductor device package, FIG. 2 is a cross sectional view of the high frequency semiconductor device package, and FIG. 3 is a partially enlarged sectional view of the high frequency semiconductor device package (indicated by a dashed circle). The semiconductor device package 100 has a shielding case composed of a metal cover 101 and a high frequency circuit substrate 103. Also, the semiconductor device package has a device 105 and chip parts 106 accommodated in the shielding case, which constitute an oscillating circuit. The high frequency circuit substrate 103 has a rectangular shape. Ground electrodes 104 are extended into concave portions formed opposite to each other on centers of two sides of the high frequency circuit substrate 103. The metal cover 101 has two tab units 102 which are formed opposite to each other on two sides of the metal cover 101.

As shown in FIG. 3, the tab unit 102 is formed such that its tip is bent in an outer side direction. Those tab units 102 are engaged with the concave portions formed opposite to each other on centers of two sides of the high frequency circuit substrate 103. The metal cover 101 is attached through the engaged portions to the high frequency circuit substrate 3. In this way, the metal cover 101 is attached to the high frequency circuit substrate 103, and the tab units 102 and the ground electrodes 104 are held in contact with each other. Thus, electrical connection is established.

In such a high frequency semiconductor device package, as shown in FIG. 3, the tab unit 102 of the metal cover 101 is bent to form a elbowed shape and a taper 102a is formed at a tip of the elbowed tab unit 102. When trying to attach the metal cover 101 to the high frequency circuit substrate 103, the tab unit 102 is slid to the concave portion by using the taper 102. Thus, the metal cover can be easily attached to the high frequency circuit substrate 103, and the high frequency circuit substrate 103 is put between the tab units 102 of the metal cover 101.

In the above-mentioned high frequency semiconductor device package, the ground electrodes 104 of the high frequency circuit substrate 103 and the tab units 102 of the metal cover 101 are joined. Thus, it is possible to form a shielding case that is almost entirely shielded from outside and to prevent the electromagnetic interference.

However, the conventional high frequency semiconductor device package mentioned above has the following problems.

In the high frequency semiconductor device package mentioned above, the inner wall of the metal cover 101 is the metal surface. Thus, when the inner wall of the metal cover 101 is brought close to the chip parts 106 and devices 105 such as FET mounted on the high frequency circuit substrate 103, the chip parts 106 and the metal cover 101 come into contact with each other. This causes an electric trouble such as a short and the like.

Also, if insulating material is coated on the inner surface of the metal cover 101 and the tab units 102 in order to prevent the above-mentioned trouble, it becomes impossible to electrically connect the tab units 102 and the ground electrodes 104 when attaching the metal cover 101 to the high frequency circuit substrate 103.

Also, an elbowed portion is formed in the tab unit 102 as shown in FIG. 3. Therefore, when sandwiching the high frequency circuit substrate 103 between the tab units 102 of the metal cover 101, the elbowed portion might become located over the upper surface of the high frequency circuit substrate 103 if the thickness of the high frequency circuit substrate 103 is small. This causes slip between the taper 102a of the tab unit 102 and the high frequency circuit substrate 103, which results in problems that the metal cover 101 comes off easily and that the high frequency circuit substrate 103 can not be made thinner.

SUMMARY OF THE INVENTION

It is therefore an object of the present invention to provide a semiconductor device package which can sufficiently maintain a shielding effect and prevent an electric trouble such as a short and the like.

It is another object of the present invention to provide a semiconductor device package which can reduce the thickness of the semiconductor device package.

It is another object of the present invention to provide a semiconductor device package which can improve productivity.

In an aspect of the present invention, a semiconductor device package includes a substrate, a semiconductor device formed on the substrate, a ground electrode formed on the substrate, a cover designed for covering the semiconductor device, and a tab unit extending from the cover and for holding the substrate. The cover has an outer surface made of conductive material and an inner surface made of insulation material, where the insulating inner surface faces the semiconductor device. The tab unit has a first contact surface which extends from the conductive outer surface and is contact with the ground electrode.

Thus, the conductive outer surface is used for establishing the electrical connection and maintaining a shielding effect. On the other hand, the inner surface works as an insulator such that an electric trouble such as a short is not caused. Therefore, the thickness of the semiconductor device package can be made small as possible. In other words, the semiconductor device package can be made smaller and thinner and the productivity is improved.

In the semiconductor device package according to the present invention, the ground electrode is formed on a side surface of the substrate. The tab unit has a base section and a contact section. This base section extends from the cover and is formed to be substantially parallel to the side surface of the substrate. The contact section is connected to the base section and has the first contact surface mentioned above. Also, the contact section includes a planar section and a bent section. The bent section connects the base section and the planar section. This planar section has the first contact surface mentioned above and is formed to be substantially parallel to the base section.

In the semiconductor device package, the planar section may be formed to touch the base section. Preferably, an angle between the first contact surface and a surface of the bent section is more than 90 degrees. In this case, the bent section of the tab unit works as a taper. Due to this bent section, it becomes easier to attach the cover to the substrate.

In the semiconductor device package, the bent section can be made straight. In this case, the bent section forms a first angle with the base section and a second angle with the planar section. Preferably, the first angle is less than 90 degrees and the second angle is more than 90 degrees. This tab unit has elasticity because of space between the base section and the planar section. Because of the elasticity, the substrate is tightly held by the cover.

In another aspect of the present invention, the tab unit further includes a stopper section extending from the contact section. This stopper section has a second contact surface which is contact with a top surface of the substrate. Thus, the stopper section works as a stopper, i.e., the resistance characteristics against the downward pressure improves.

In the semiconductor device package, the contact section can include the planar section having the first contact surface the bent section connecting the base section and the planar section. In this case, the stopper section extends from the planar section.

In the semiconductor device package, the stopper section can be formed to be substantially perpendicular to the planar section. In this case, the second contact surface mentioned above extends from the first contact surface. Also, the stopper section can be formed to be substantially parallel to the planar section such that the planar section is between the base section and the stopper section. In this case, the insulating inner surface belonging to the stopper section faces the semiconductor device. Thus, even if the semiconductor device is brought close to the stopper section, an electrical trouble such as a short is never caused.

The tab unit described above is made of a tab member. This tab member extends from the cover, and has the outer surface and the inner surface similar to the cover. The contact section is formed by bending the tab member into a direction of the inner surface such that the first contact surface is contact with the ground electrode. Also, the stopper section is formed by further bending the tab member into a direction of the outer surface such that the second contact surface is contact with the top surface of the substrate.

In the semiconductor device package, the substrate can have a rectangular shape and a pair of ground electrodes is formed opposite to each other on two side surfaces of the substrate. Also, the cover can have a rectangular shape in order to fit the substrate and have a pair of tab units used for holding the substrate. The pair of tab units is formed opposite to each other on two sides of the cover, and each of the pair of tab units has the above-mentioned first contact surface extending from the outer surface. In this case, the first contact surfaces of the pair of tab units are contact with the pair of ground electrodes, respectively. The substrate is sandwiched between the pair of tab units.

DESCRIPTION OF THE PREFERRED EMBODIMENTS

Embodiments of the present invention will be described below with reference to the attached drawings.

First Embodiment

Figure 1:
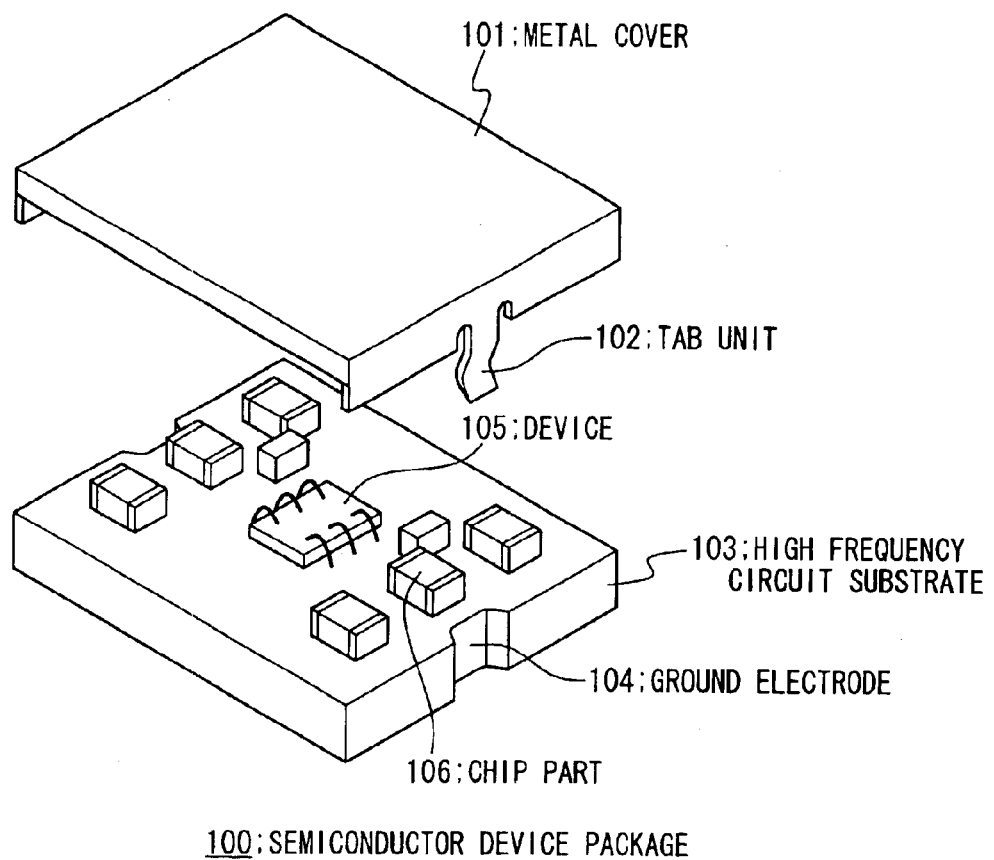
FIG. 1 is an exploded view of a conventional high frequency semiconductor device package.
Figure 2:
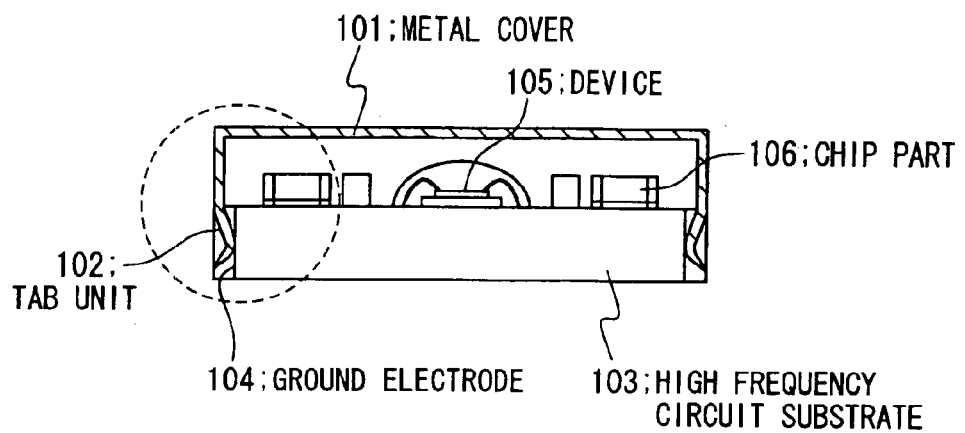
FIG. 2 is a cross sectional view explaining the conventional high frequency semiconductor device package.
Figure 3:
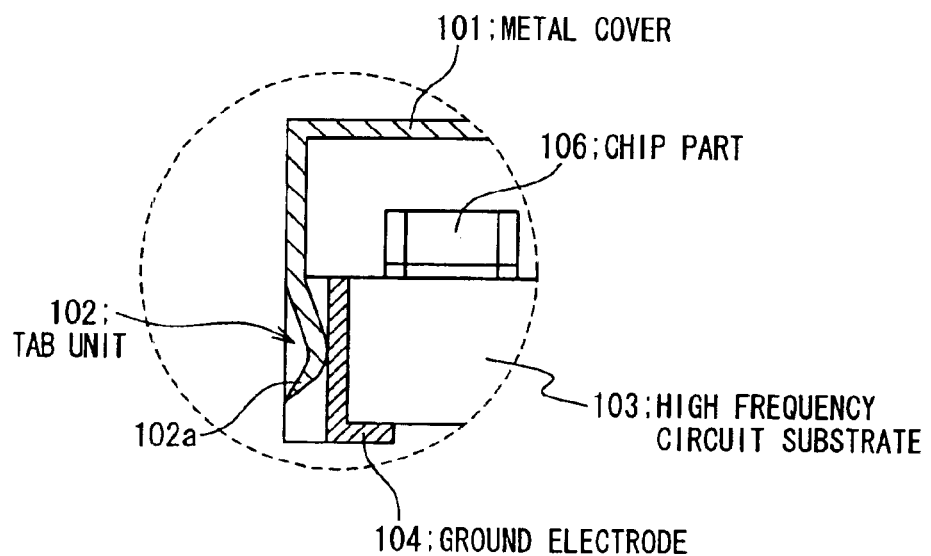
FIG. 3 is a partially enlarged sectional view explaining the conventional high frequency semiconductor device package.
Figure 4:
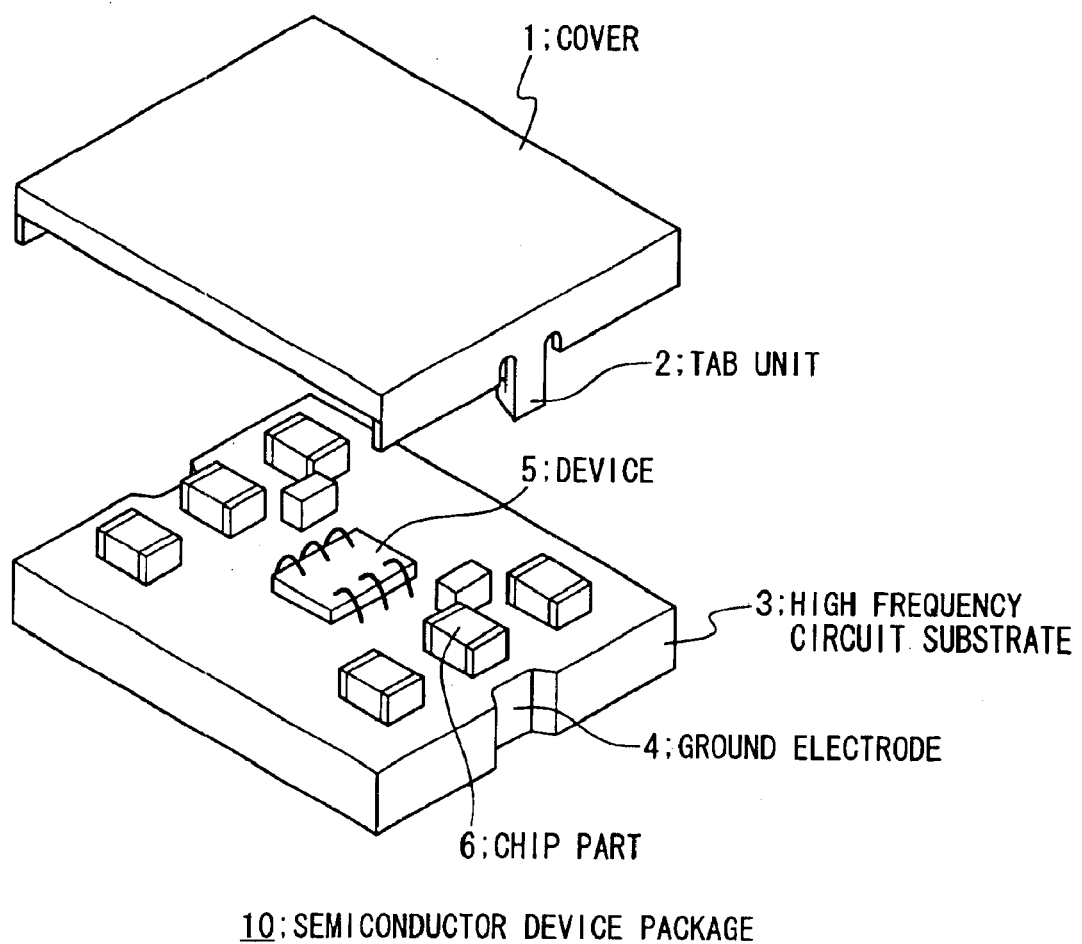
FIG. 4 is an exploded perspective view of a high frequency semiconductor device package according to a first embodiment of the present invention.
Figure 5:
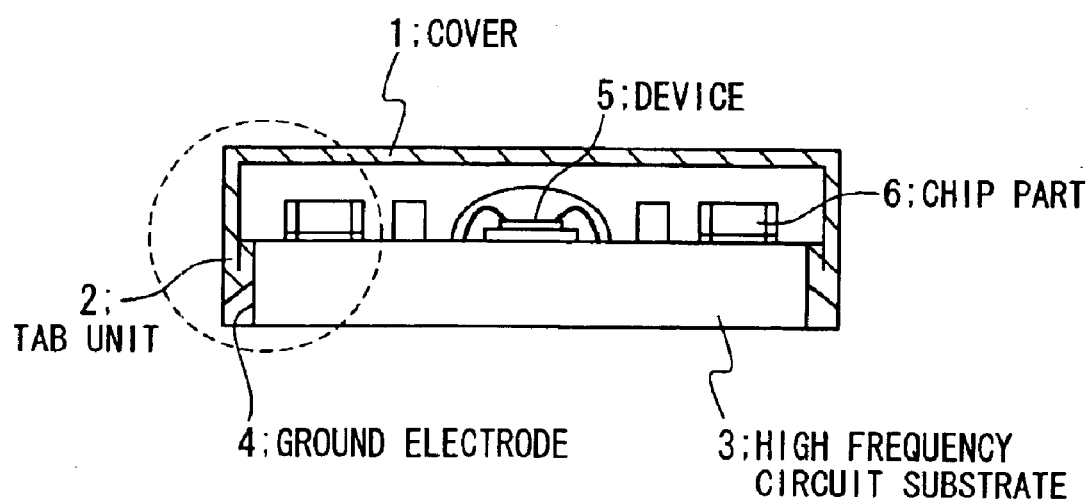
FIG. 5 is a cross sectional view of a high frequency semiconductor device package according to a first embodiment of the present invention.
Figure 6:
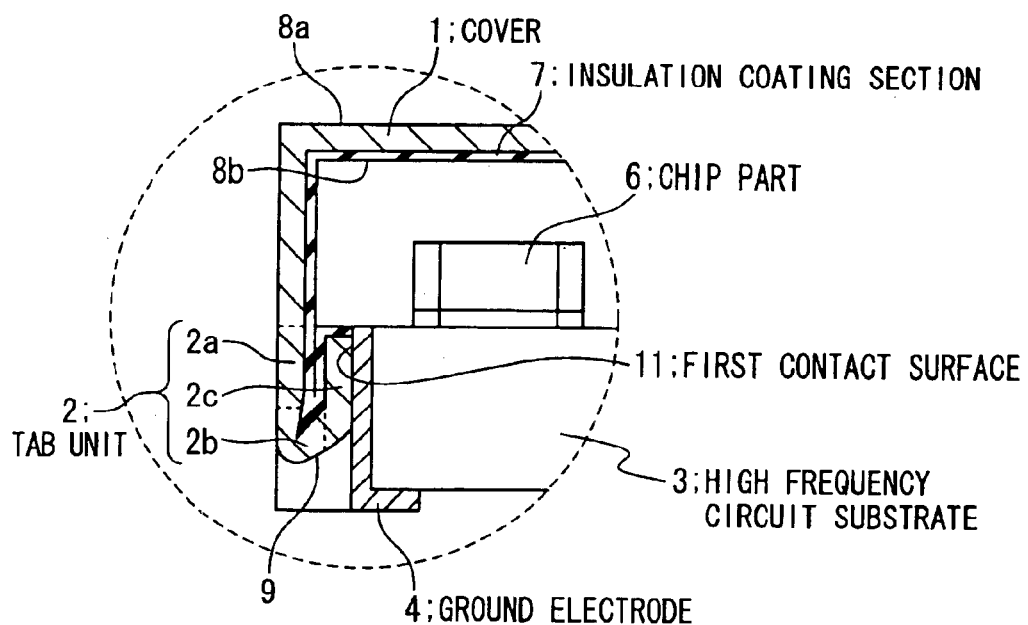
FIG. 6 is a partially enlarged sectional view of a high frequency semiconductor device package according to a first embodiment of the present invention.

FIGS. 4 to 6 show a high frequency semiconductor device package according to a first embodiment of the present invention. FIG. 4 is an exploded perspective view of the high frequency semiconductor device package, FIG. 5 is a cross sectional view of the high frequency semiconductor device package, and FIG. 6 is a partially enlarged sectional view of the high frequency semiconductor device package (indicated by a dashed circle).

The semiconductor device package 10 according to the present invention has a cover 1 and a high frequency circuit substrate 3, to form a shielding case. Also, the semiconductor device package 10 has a device 5 and chip parts 6 formed on the high frequency circuit substrate 3 and accommodated in the shielding case. The device 5 and the chip parts 6 constitute an oscillating circuit. For example, the device 5 includes a FET, and the chip parts include chip condensers, chip resistors, chip inductors and the like As shown in FIG. 4, the cover 1 and the high frequency circuit substrate 3 have a rectangular shape, and the cover 1 is designed for covering the device 5 and the chip parts 6. In the present embodiment, a pair of ground electrodes 4 is formed opposite to each other on two side surfaces of the high frequency circuit substrate 3. Also, the cover 1 has a pair of tab units 2 which is formed opposite to each other on two sides of the cover 1. Each of the tab units 2 is formed to extend from the cover 1. As described below, these tab units 2 is used for holding the high frequency circuit substrate 3.

According to the present invention, the cover 1 has an outer surface 8a made of conductive material and an inner surface 8b made of insulation material. More specifically, the cover 1 includes a metal section and an insulation coating section 7 formed on the metal section as shown in FIG. 6. The outer surface 8a belongs to the metal section, and the inner surface 8b belongs to the insulation coating section 7. Also, the inner surface 8b faces the semiconductor devices such as the device 5 and the chip parts 6.

The tab unit 2 extends from the cover 1. Thus, the tab unit 2 also has a conductive surface extended from the outer surface 8a and an insulation surface extended from the inner surface 8b. Especially, the tab unit 2 has a first contact surface 11 which is to be contact with the ground electrode 4. As shown in FIG. 6, the first contact surface 11 extends from the outer surface 8a.

According to the present embodiment, the tab unit 2 includes a base section 2a and a contact section (2b, 2c). As shown in FIG. 6, the base section 2a extends from the cover 1 and is formed to be substantially parallel to a side surface of the high frequency circuit substrate 3. The contact section of the tab unit 2 is connected to the base section 2a and has the first contact surface 11 mentioned above.

More specifically, the contact section above includes a bent section 2b and a planar section 2c. The bent section 2b connects the base section 2a and the planar section 2c. The planar section 2c has the first contact surface 11, i.e., the planar section 2c is to be contact with the ground electrode 4. As shown in FIG. 6, the planar section 2c is formed to be substantially parallel to the base section 2a, i.e., parallel to the side surface of the high frequency circuit substrate 3. In FIG. 6, the planar section 2c is formed to touch the base section 2a through the insulation coating section 7. Here, an angle between the first contact surface 11 and a surface 9 of the bent section 2b is formed to be more than 90 degrees. Thus, the bent section 2b becomes a taper section, with which the cover 1 can be easily attached to the high frequency circuit substrate 3.

The cover 1 as mentioned above is attached to the high frequency circuit substrate 3 through the tab units 2. Here, the cover 1 can be slid on the above-mentioned taper section and smoothly attached. As a result, the first contact surfaces 11 of the pair of tab units 2 are brought into contact with the pair of ground electrode 4 of the high frequency circuit substrate 3, respectively. Thus, the electrical connection between the cover 1 and the high frequency circuit substrate 3 is established. Under this condition, the high frequency circuit substrate 3 is sandwiched between the pair of tab units 2 which is formed opposite to each other on two sides of the cover 1. Then, applied tension works and the high frequency circuit substrate 3 and the cover 1 are kept unseparated.

A method for manufacturing the cover 1 is described below. First, the cover 1 with a pair of tab members is provided. Here, the pair of tab members is formed opposite to each other on two sides of the cover 1. This cover 1 has the outer surface 8a made of conductive material and the inner surface 8b made of insulation material. Each of the tab members extends from the cover 1 and hence has the outer surface 8a and the inner surface 8b.

Next, the tab member is bent into a direction of the inner surface 8b as shown in FIG. 6, to form the base section 2a and the contact section (2b, 2c). As a result, the outer surface 8a belonging to the contact section faces a side of the high frequency circuit substrate 3. Thus, a part of the outer surface 8a, i.e., the first contact surface 11 is formed to be contact with the ground electrode 4 on the side of the high frequency circuit substrate 3.

The tab member may be bent for about 180 degrees to form the bent section 2b and the planar section 2c as shown in FIG. 6. The planar section 2c is formed to be substantially parallel to the base section 2a and to touch the base section 2a. This planar section 2c has the first contact surface 11, i.e., the planar section 2c is to be contact with the ground electrode 4.

As described above, in the semiconductor device package 10 according to the present invention, the first contact surface 11 extending from the conductive outer surface 8a is formed on the inner side of the tab unit 2. When the cover 1 is attached to the high frequency circuit substrate 3, the first contact surface 11 is brought into contact with the ground electrode 4. Thus, the electrical connection is established. Also, the conductive outer surface 8a works as a shield for maintaining a shielding effect sufficiently.

Moreover, the cover 1 faces the semiconductor device (chip parts 6 and device 5) on the side of the inner surface 8b made of insulation material (see FIG. 6). Therefore, even if the cover 1 is brought close to the high frequency circuit substrate 3 and comes into contact with the semiconductor device, an electric trouble such as a short is not caused. Thus, according to the semiconductor device package 10 in the present invention, it becomes possible not only to prevent the electric trouble but also to reduce the thickness of the semiconductor device package 10. This also means the improvement of the productivity, since material necessary for manufacturing the semiconductor device 10 is reduced.

Furthermore, formed in the tab unit 2 is the planar section 2c which is substantially parallel to the side surface of the high frequency circuit substrate 3. Therefore, even if the tab unit 2 contacts only with the upper part of the ground electrode 4, the cover 1 can tightly hold the high frequency circuit substrate 3. This also means that it is possible to reduce the thickness of the high frequency circuit substrate 3 and to improve the productivity of the semiconductor device package 10.

Furthermore, the bent section 2b of the tab unit 2 works as a taper. Due to this bent section 2b, it becomes easier to attach the cover 1 to the high frequency circuit substrate 3. As a result, the productivity of the semiconductor device package 10 is improved.

Second Embodiment

Figure 7:
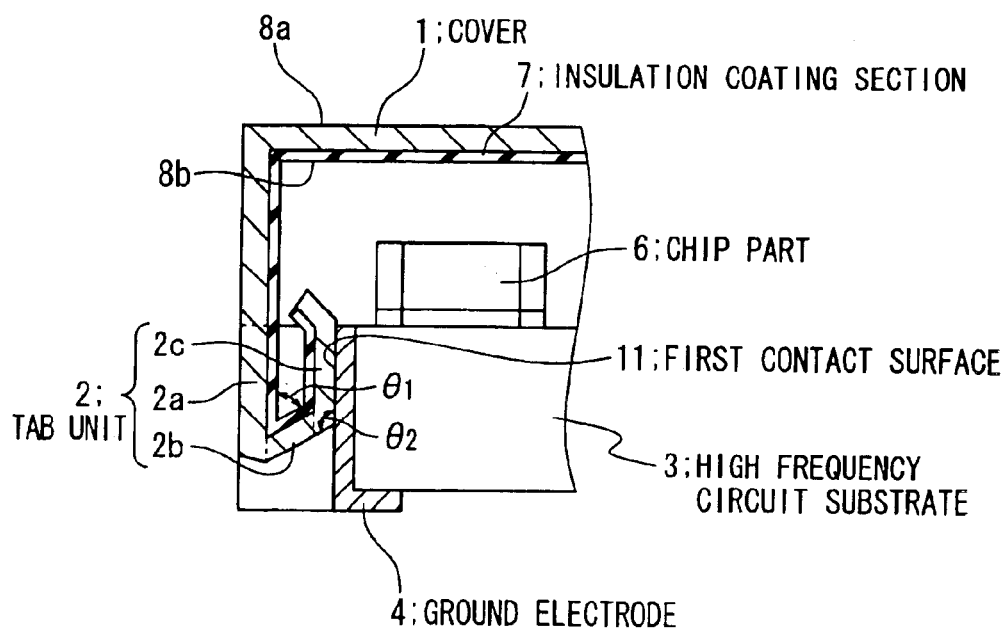
FIG. 7 is a partially enlarged sectional view of a high frequency semiconductor device package according to a second embodiment of the present invention.

FIG. 7 shows a high frequency semiconductor device package according to a second embodiment of the present invention. In FIG. 7, the same reference number as in FIG. 6 is given to a structure similar to that in FIG. 6, and a detailed explanation of the structure will be omitted.

The tab unit 2 has a base section 2a, a bent section 2b and a planar section 2c. The base section 2a and the planar section 2c are formed to be substantially parallel to the side surface of the high frequency circuit substrate 3. The bent section 2b connects the base section 2a and the planar section 2c. In the present embodiment, the tab unit 2 has a "trapezoidal cross section" as shown in FIG. 7. More specifically, the bent section 2b is designed to be straight and forms a first angle θ1 with the base section 2a and a second angle θ2 with the planar section 2c. The first angle θ1 is less than 90 degrees and the second angle θ2 is more than 90 degrees as shown in FIG. 7. Thus, the tab unit 2 becomes a taper section, with which the cover 1 can be easily attached to the high frequency circuit substrate 3.

The cover 1 mentioned above is attached to the high frequency circuit substrate 3. The planar section 2c has the first contact surface 11 which is contact with the ground electrode 4. The first contact surface 11 extends from the conductive outer surface 8a. Thus, the electrical connection is established. It should be noted that the tab unit 2 mentioned above has elasticity because of space between the base section 2a and the planar section 2c. When the pair of tab units 2 is engaged with the ground electrodes 4 formed opposite to each other, the high frequency circuit substrate 3 is elastically held by the pair of tab units 2.

The semiconductor device package 10 according to the present embodiment has the same effects as in the case of the first embodiment. That is, a shielding effect is sufficiently maintained, and an electric trouble such as a short is prevented due to the inner surface 8b made of insulation material. Also, it is possible to reduce the thickness of the high frequency circuit substrate 3 and the semiconductor device package 10. In other words, the semiconductor device package 10 can be made smaller and thinner and the productivity is improved.

Moreover, because of the elasticity of the pair of tab units 2, the high frequency circuit substrate 3 is tightly held by the cover 1. Thus, the ground electrodes 4 of the high frequency circuit substrate 3 and the tab units 2 of the cover 1 are in strong contact with each other.

Third Embodiment

Figure 8:
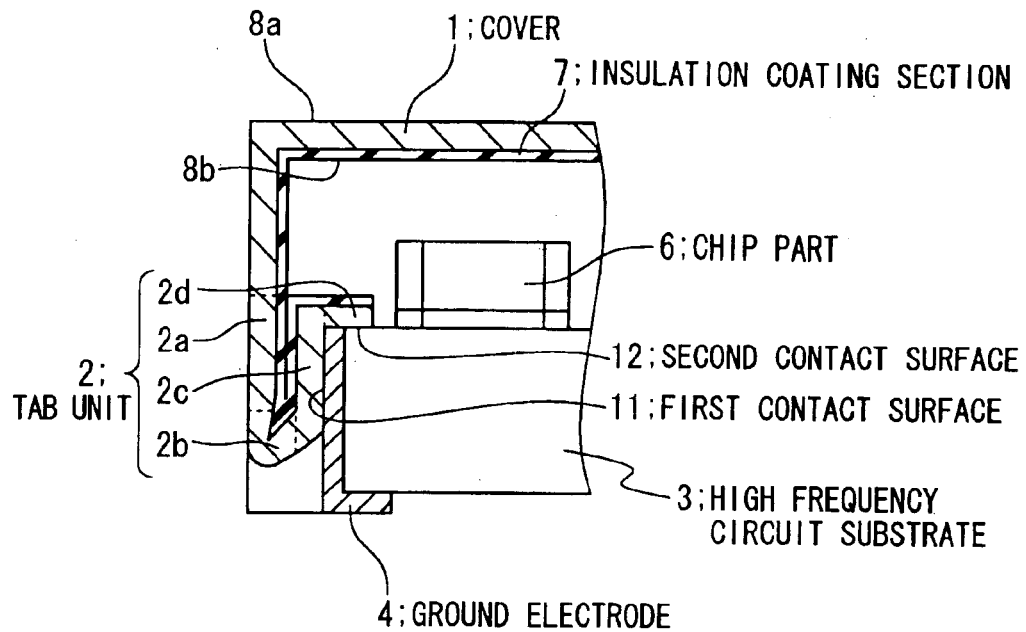
FIG. 8 is a partially enlarged sectional view of a high frequency semiconductor device package according to a third embodiment of the present invention.

FIG. 8 shows a high frequency semiconductor device package according to a third embodiment of the present invention. In FIG. 8, the same reference number as in FIG. 6 is given to a structure similar to that in FIG. 6, and a detailed explanation of the structure will be omitted.

In the present embodiment, the tab unit 2 has a stopper section 2d in addition to the base section 2a, the bent section 2b and the planar section 2c. The base section 2a and the planar section 2c are formed to be substantially parallel to the side surface of the high frequency circuit substrate 3. The bent section 2b connects the base section 2a and the planar section 2c. The planar section 2c has the first contact surface 11 which is contact with the ground electrode 4.

The stopper section 2d extends from the planar section 2c as shown in FIG. 8. In the present embodiment, the stopper section 2d is formed to be substantially perpendicular to the planar section 2c. Also, the stopper section 2d has a second contact surface 12 which is contact with a top surface of the high frequency circuit substrate 3. Here, the second contact surface 12 extends from the first contact surface 11, i.e., from the outer surface 8a.

A method for manufacturing the cover 1 is described below. First, the cover 1 with a pair of tab members is provided. This cover 1 has the outer surface 8a made of conductive material and the inner surface 8b made of insulation material. Each of the tab members extends from the cover 1 and hence has the outer surface 8a and the inner surface 8b.

Next, the tab member is bent into a direction of the inner surface 8b, to form the base section 2a and the contact section (2b, 2c). Thus, the first contact surface 11 is formed to be contact with the ground electrode 4 on the side of the high frequency circuit substrate 3. Next, the tab member is further bent into a direction of the outer surface 8a, to form the stopper section 2d. Thus, the second contact surface 12 is formed to be contact with the top surface of the high frequency circuit substrate 3.

The semiconductor device package 10 according to the present embodiment has the same effects as in the case of the first embodiment. That is, a shielding effect is sufficiently maintained, and an electric trouble such as a short is prevented due to the inner surface 8b made of insulation material. Also, it is possible to reduce the thickness of the high frequency circuit substrate 3 and the semiconductor device package 10. In other words, the semiconductor device package 10 can be made smaller and thinner and the productivity is improved.

Moreover, when the cover 1 is attached to the high frequency circuit substrate 3, the stopper section 2d mentioned above is brought into contact with the top surface of the high frequency circuit substrate 3. Thus, the stopper section 2d works as a stopper. It is possible to keep the distance between the inner surface 8b of the cover 1 and the top surface of the high frequency circuit substrate 3. Therefore, the cover 1 is prevented from being too close to the high frequency circuit substrate 3. Also, the resistance characteristics against the downward pressure improves.

It should be noted that the stopper section 2d according to the present embodiment can be also applied to the tab unit 2 shown in the second embodiment.

Fourth Embodiment

Figure 9:
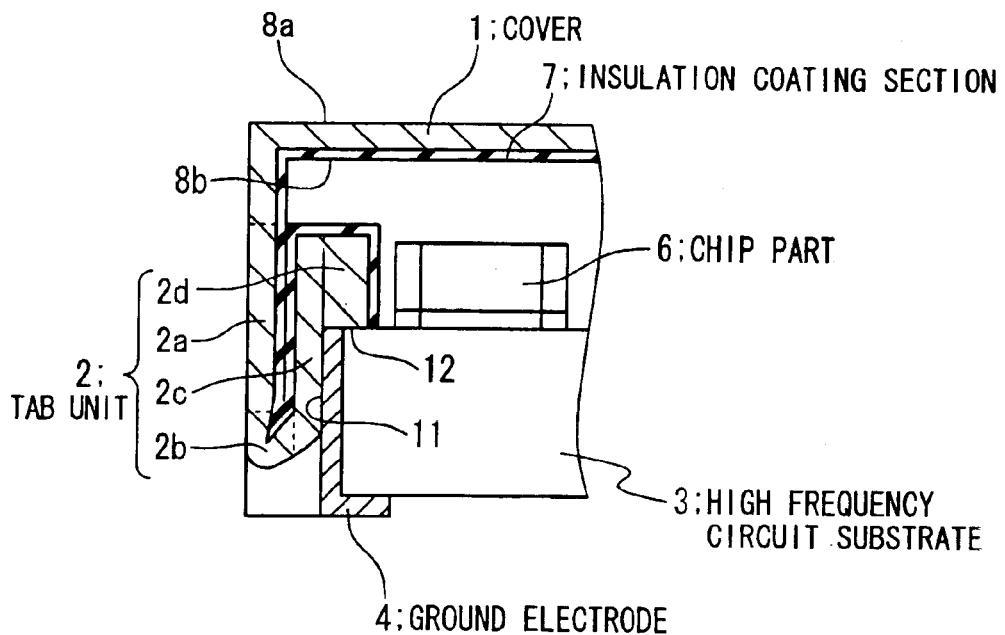
FIG. 9 is a partially enlarged sectional view of a high frequency semiconductor device package according to a fourth embodiment of the present invention.

FIG. 9 shows a high frequency semiconductor device package according to a fourth embodiment of the present invention. In FIG. 9, the same reference number as in FIG. 8 is given to a structure similar to that in FIG. 8, and a detailed explanation of the structure will be omitted.

In the present embodiment, the tab unit 2 has a stopper section 2d similar to the third embodiment mentioned above. The stopper section 2d extends from the planar section 2c. In the present embodiment, the stopper section 2d is formed to be substantially parallel to the planar section 2c and the base section 2a as shown in FIG. 9. The stopper section 2d has a second contact surface 12 which is contact with a top surface of the high frequency circuit substrate 3. Here, the second contact surface 12 is formed on the edge of the tab member.

The semiconductor device package 10 according to the present embodiment has the same effects as in the case of the third embodiment. That is, a shielding effect is sufficiently maintained, and an electric trouble such as a short is prevented due to the inner surface 8b made of insulation material. Also, the semiconductor device package 10 can be made smaller and thinner and the productivity is improved.

Moreover, when the cover 1 is attached to the high frequency circuit substrate 3, the stopper section 2d mentioned above is brought into contact with the top surface of the high frequency circuit substrate 3. Thus, the stopper section 2d works as a stopper, and the resistance characteristics against the downward pressure improves.

Furthermore, in the present embodiment, the planar section 2c is located between the base section 2a and the stopper section 2d. The inner surface 8b belonging to the stopper section 2d faces the chip parts 6 as shown in FIG. 9. Thus, even if the chip part 6 is brought close to the stopper section 2d, an electrical trouble such as a short is never caused.

It should be noted that the stopper section 2d according to the present embodiment can be also applied to the tab unit 2 shown in the second embodiment.

It will be obvious to one skilled in the art that the present invention may be practiced in other embodiments that depart from the above-described specific details. The scope of the present invention, therefore, should be determined by the following claims.

What is claimed is:

1. A semiconductor device package comprising:
   a substrate;
   a semiconductor device formed on said substrate;
   a ground electrode formed on said substrate;
   a cover designed for covering said semiconductor device; and
   a tab unit extending from said cover and for holding said substrate,
   wherein said cover has an outer surface made of conductive material and an inner surface made of insulation material, said inner surface facing said semiconductor device,
   wherein said tab unit has a first contact surface which extends from said outer surface and is contact with said ground electrode.

2. The semiconductor device package according to claim 1,
   wherein said ground electrode is formed on a side surface of said substrate,
   wherein said tab unit includes:
   a base section extending from said cover; and
   a contact section connected to said base section and having said first contact surface,
   wherein said base section is formed to be substantially parallel to said side surface of said substrate.

3. The semiconductor device package according to claim 2, wherein said contact section includes:
   a planar section having said first contact surface; and
   a bent section connecting said base section and said planar section,
   wherein said planar section is substantially parallel to said base section.

4. The semiconductor device package according to claim 3, wherein said planar section is formed to touch said base section.

5. The semiconductor device package according to claim 3, wherein an angle between said first contact surface and a surface of said bent section is more than 90 degrees.

6. The semiconductor device package according to claim 3, wherein said bent section is straight and forms a first angle with said base section and a second angle with said planar section, said first angle being less than 90 degrees and said second angle being more than 90 degrees.

7. The semiconductor device package according to claim 2, wherein said tab unit further includes a stopper section extending from said contact section and having a second contact surface which is contact with a top surface of said substrate.

8. The semiconductor device package according to claim 7, wherein said contact section includes:
   a planar section having said first contact surface and being substantially parallel to said base section; and
   a bent section connecting said base section and said planar section,
   wherein said stopper section extends from said planar section.

9. The semiconductor device package according to claim 8, wherein said stopper section is substantially perpendicular to said planar section, and said second contact surface extends from said first contact surface.

10. The semiconductor device package according to claim 8, wherein said stopper section is formed to be substantially parallel to said planar section such that said planar section is between said base section and said stopper section and said inner surface belonging to said stopper section faces said semiconductor device.

11. The semiconductor device package according to claim 2,
   wherein said tab unit is made of a tab member with said outer surface and said inner surface,
   wherein said contact section is formed by bending said tab member into a direction of said inner surface such that said first contact surface is contact with said ground electrode.

12. The semiconductor device package according to claim 11,
wherein said tab unit further includes a stopper section extending from said contact section and having a second contact surface,
wherein said stopper section is formed by further bending said tab member into a direction of said outer surface such that said second contact surface is contact with a top surface of said substrate.

13. A semiconductor device package comprising:
a substrate;
a semiconductor device formed on said substrate;
a pair of ground electrodes formed on said substrate;
a cover designed for covering said semiconductor device; and
a pair of tab units extending from said cover and for holding said substrate,
wherein said cover has an outer surface made of conductive material and an inner surface made of insulation material, said inner surface facing said semiconductor device,
wherein each of said pair of tab units has a first contact surface extending from said outer surface,
wherein said first contact surfaces of said pair of tab units are contact with said pair of ground electrodes, respectively.

14. The semiconductor device package according to claim 13, wherein said pair of ground electrodes is formed opposite to each other on two sides of said substrate.

* * * * *

UNITED STATES PATENT AND TRADEMARK OFFICE
CERTIFICATE OF CORRECTION

PATENT NO. : 6,881,896 B2
DATED : April 19, 2005
INVENTOR(S) : Masami Ebihara

It is certified that error appears in the above-identified patent and that said Letters Patent is hereby corrected as shown below:

<u>Title page,</u>
Item [73], Assignee, should be:
-- NEC Compound Semiconductor Devices, Ltd.,
  Nakagawa (JP) --.

Signed and Sealed this

Twenty-seventh Day of September, 2005

JON W. DUDAS
*Director of the United States Patent and Trademark Office*